(12) United States Patent
Najar

(10) Patent No.: US 10,510,915 B2
(45) Date of Patent: Dec. 17, 2019

(54) POROUS SILICON NANOWIRE PHOTOVOLTAIC CELL

(71) Applicant: UNITED ARAB EMIRATES UNIVERSITY, Al Ain (AE)

(72) Inventor: Adel Najar, Al Ain (AE)

(73) Assignee: United Arab Emirates University, Al-Ain (AE)

( * ) Notice: Subject to any disclaimer, the term of this patent is extended or adjusted under 35 U.S.C. 154(b) by 0 days.

(21) Appl. No.: 16/406,153

(22) Filed: May 8, 2019

(65) Prior Publication Data

US 2019/0267506 A1 Aug. 29, 2019

Related U.S. Application Data

(63) Continuation-in-part of application No. 15/417,210, filed on Jan. 26, 2017, now abandoned.

(51) Int. Cl.
*H01L 31/055* (2014.01)
*H01L 31/028* (2006.01)
(Continued)

(52) U.S. Cl.
CPC ........ *H01L 31/074* (2013.01); *H01L 31/0284* (2013.01); *H01L 31/022475* (2013.01);
(Continued)

(58) Field of Classification Search
None
See application file for complete search history.

(56) References Cited

U.S. PATENT DOCUMENTS 7,973,995 B2 * 7/2011 Black .................. G02F 2/02
359/245
9,263,612 B2 2/2016 Tamboli et al.
(Continued)

FOREIGN PATENT DOCUMENTS

| CN | 101436615 A | 5/2009 |
|---|---|---|
| CN | 103361060 A | 10/2013 |
| WO | 2012054368 A2 | 4/2012 |

OTHER PUBLICATIONS

Peng, Kui-Qing, and Shuit-Tong Lee. "Silicon nanowires for photovoltaic solar energy conversion," Advanced Materials 23.2 (2011): 198-215.
(Continued)

*Primary Examiner* — Tamir Ayad
(74) *Attorney, Agent, or Firm* — Richard C. Litman; Nath, Goldberg & Meyer

(57) ABSTRACT

The porous silicon nanowire photovoltaic cell includes a first electrode, an n-type silicon layer, and a second electrode, which is formed from a transparent electrode with at least one metal contact. An array of porous silicon nanowires is sandwiched between the second electrode and the n-type silicon layer. Each of the porous silicon nanowires is formed from a porous n-type silicon core coated with a layer of p-type silicon. Empty spaces between the porous silicon nanowires of the array may be filled with indium tin oxide, thus forming a photoactive region formed from the array of porous silicon nanowires embedded in indium tin oxide. An up-conversion layer is sandwiched between the first electrode and the n-type silicon layer. Any suitable type of up-conversion material may be used for the up-conversion layer, such as $NaYR_4$:Er—Yb or the like. Alternatively, the up-conversion layer may be replaced by a down-conversion layer.

3 Claims, 2 Drawing Sheets

(51) Int. Cl.
*H01L 31/074* (2012.01)
*H01L 31/0336* (2006.01)
*H01L 31/0352* (2006.01)
*H01L 31/0224* (2006.01)

(52) U.S. Cl.
CPC .. *H01L 31/0336* (2013.01); *H01L 31/035227* (2013.01); *H01L 31/055* (2013.01)

(56) References Cited

U.S. PATENT DOCUMENTS

| | | |
|---|---|---|
| 2009/0050204 A1 | 2/2009 | Habib |
| 2013/0048059 A1 | 2/2013 | Han et al. |
| 2013/0081679 A1 | 4/2013 | Qu et al. |
| 2015/0194549 A1 | 7/2015 | Weman et al. |
| 2015/0337438 A1 | 11/2015 | Hong et al. |

OTHER PUBLICATIONS

Wang, Hai-Ciao, et al. "Rare-earth ion doped up-conversion materials for photovoltaic applications." Advanced Materials 23.22-23 (2011): 2675-2680.

Jouiad, Mustapha, and Adel Najaf. "Porous silicon nanowires: synthesis and applications." Biointerface Research in Applied Chemistry 5.2 (2015).

* cited by examiner

POROUS SILICON NANOWIRE PHOTOVOLTAIC CELL

CROSS-REFERENCE TO RELATED APPLICATION

This application is a continuation-in-part of U.S. patent application Ser. No. 15/417,210, filed on Jan. 26, 2017.

BACKGROUND

1. Field

The disclosure of the present patent application relates to photovoltaics, and particularly to a porous silicon nanowire photovoltaic cell using an array of porous silicon nanowires as a p-n junction, as well as an additional up-conversion layer.

2. Description of the Related Art

Photovoltaic devices typically employ a planar thin-film structure in which a negatively doped (n-type) material is stacked on top of a positively doped (p-type) material, or a positively doped (p-type) material is stacked on top of a negatively doped (n-type) material. In these planar photovoltaic devices, the light absorbing layer needs to be thick enough to effectively absorb impinging photons with energies larger than the bandgap energy of the light absorbing material. However, when the light absorbing layer in a planar structure is made thicker, this compromises the effective collection of the photo-generated carriers as the thickness of the light absorbing layer may be larger than the diffusion length of the minority carriers. Thus, the design of typical planar photovoltaic devices leads to a compromise between the thickness of the light absorbing layer for efficient light absorption and the effectiveness of carrier collection, thereby imposing limits on the efficiencies of these devices. As an example, a typical thin-film GaAs solar cell requires a light absorbing layer several microns thick to effectively absorb photons with energies higher than its bandgap energy, but as the diffusion length of the minority carriers is typically only a few hundred nanometers, many of the photo-generated carriers cannot be collected.

Rather than using planar p-n junctions in photovoltaic devices, radial p-n junctions are presently under investigation. In these structures, a long central n-type core extends out of a substrate and a p-type shell is wrapped around the core. In alternative configurations, the core is of a p-type material, while the shell is formed of an n-type material. Examples of such materials under investigation include nanowires formed from a GaAs core surrounded by an AlGaAs shell, as well as ZnO nanowires used in organic dye-based photovoltaic cells. Using such structures, one of the two photo-generated carrier types is collected in the shell orthogonally to the light absorption along the length of the core. Unlike in planar p-n junctions, increasing the length of the core to improve light absorption does not increase the distance the carriers need to travel before being collected, and therefore does not lead to the trade-off in light absorption and carrier collection found in typical planar devices.

Recent developments in the fabrication of nanowires extending out of substrates have made it possible to manufacture radial p-n junction photovoltaic devices. However, the efficiencies that have been achieved with these radial p-n junctions have been substantially less than corresponding planar devices, typically achieving solar cell efficiencies of less than 10%. It would be desirable to be able to fabricate a nanowire-based photovoltaic cell with efficiencies similar to, or surpassing, those of planar silicon photovoltaic cells.

Thus, a porous silicon nanowire photovoltaic cell solving the aforementioned problems is desired.

SUMMARY

The porous silicon nanowire photovoltaic cell includes a photoactive region including porous silicon nanowires and an up-conversion layer. The porous silicon nanowire photovoltaic cell includes a first electrode, which may be formed from any suitable type of metal or the like, an n-type silicon layer, and a second electrode, which is formed from a transparent electrode with at least one metal contact. Similar to the first electrode, the at least one metal contact may be formed from any suitable type of metal, such as gold or the like, as in a conventional photovoltaic cell. The transparent electrode may be formed from any suitable type of conductive glass or the like, such as indium tin oxide (ITO), for example.

A vertical array of porous silicon nanowires is sandwiched between the second electrode and the n-type silicon layer. Each of the porous silicon nanowires is formed from a porous n-type silicon core coated with a layer of p-type silicon. Empty spaces between the porous silicon nanowires of the array may be filled with ITO, for example, thus forming a photoactive region formed from the array of porous silicon nanowires embedded in ITO or the like.

An up-conversion layer is sandwiched between the first electrode and the n-type silicon layer. The up-conversion layer converts low-energy photons, which are reflected from the first electrode, into higher-energy photons, which can then be absorbed by the photoactive region, contributing to the overall photocurrent. Any suitable type of up-conversion material may be used for the up-conversion layer, such as $NaYF_4$:Er—Yb or the like.

In an alternative embodiment, the up-conversion layer is replaced by a down-conversion layer. In this embodiment, the porous silicon nanowire photovoltaic cell includes a first electrode, which may be formed from any suitable type of metal or the like, a p-type silicon layer, and a second electrode formed from a transparent electrode and at least one metal contact, as in the previous embodiment. Further, similar to the previous embodiment, a photoactive layer is formed from a vertical array of porous silicon nanowires, but only partially embedded in an indium tin oxide filler. Each porous silicon nanowire is formed from a porous p-type silicon core coated with a layer of n-type silicon. The photoactive layer is positioned between the p-type silicon layer and the second electrode. The down-conversion layer completely fills a space between the second electrode and the indium tin oxide filler of the photoactive layer. Any suitable type of down-conversion material may be used for the down-conversion layer, such as $LiGdF_4$:$Eu^{3+}$ or the like.

These and other features of the present disclosure will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1:
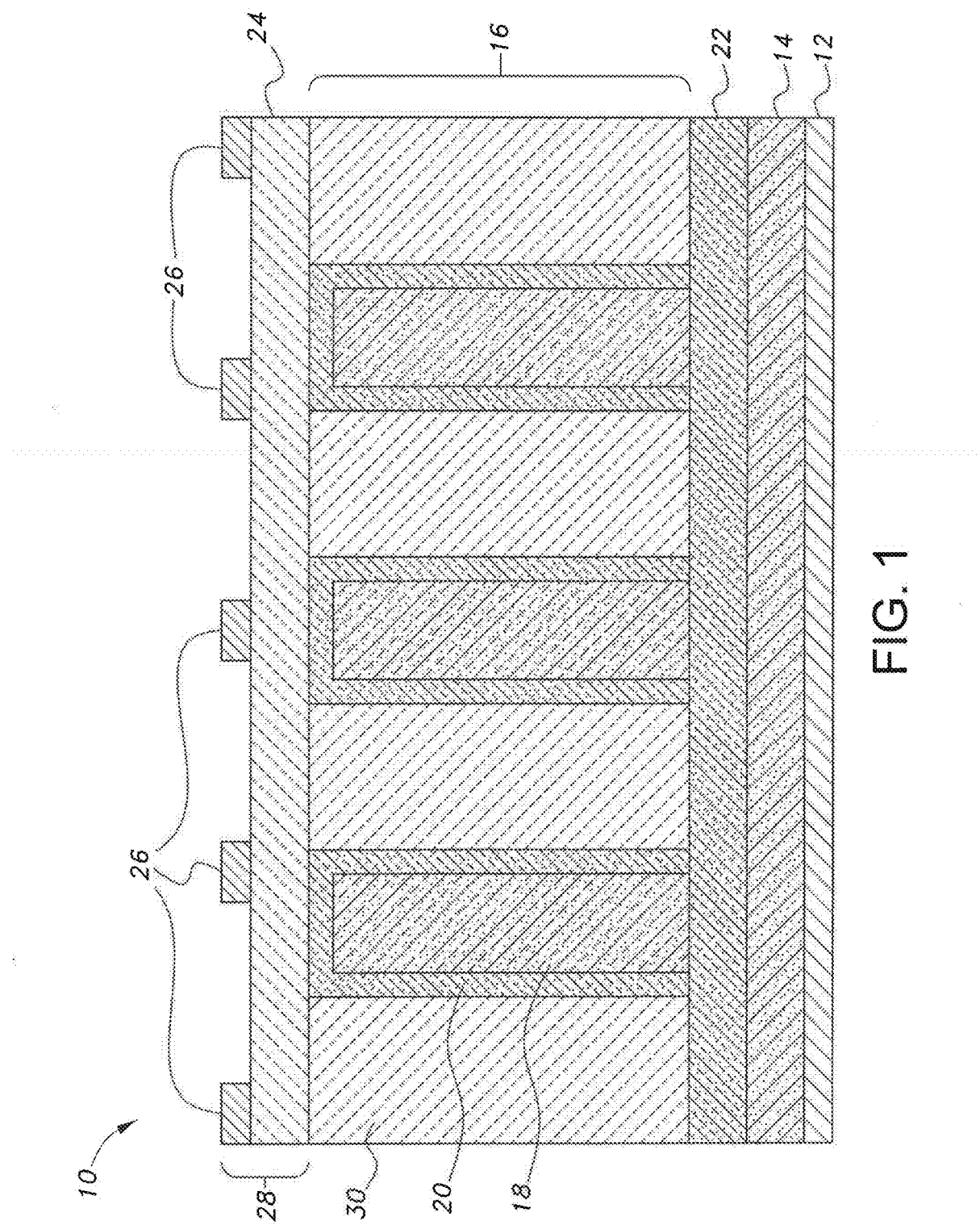
FIG. 1 is a side view in section of a porous silicon nanowire photovoltaic cell.

The porous silicon nanowire photovoltaic cell 10 includes a photoactive layer formed from porous silicon nanowires and an additional up-conversion layer. Similar to a conventional photovoltaic cell, as show in FIG. 1, the porous silicon nanowire photovoltaic cell 10 includes a first electrode 12, which may be formed from any suitable type of metal or the like, an n-type silicon layer 22, and a second electrode 28, which is formed from a transparent electrode 24 with at least one metal contact 26. Similar to the first electrode 12, the at least one metal contact 26 may be formed from any suitable type of metal, such as gold or the like, as in a conventional photovoltaic cell. The transparent electrode 24 may be formed from any suitable type of conductive glass or the like, such as indium tin oxide (ITO), for example.

An array of porous silicon nanowires 16 is sandwiched between the second electrode 28 and the n-type silicon layer 22. Each of the porous silicon nanowires 16 is formed from a porous n-type silicon core 18 coated with a layer of p-type silicon 20. Empty spaces between the porous silicon nanowires of the array 16 may be filled with ITO 30, for example, thus forming a photoactive region formed from the array of porous silicon nanowires 16 embedded in ITO 30 or the like. As shown in FIG. 1, the porous silicon nanowires 16 are preferably vertically aligned and substantially parallel with respect to one another. It should be understood that the photoactive region, either with the additional ITO 30 or without the additional material, acts as a p-n junction, similar to that of a conventional photovoltaic cell. The photoactive region may alternatively be formed from luminescent quantum dots or metal nanoparticles, either alone or embedded in the ITO. The porous silicon nanowires 16 may be formed by any suitable process, such as metal assisted chemical etching (MacEtch) or the like. Alternatively, the porous silicon nanowires 16 may be formed, for example, by combining electrical anodization (i.e., for the formation of the porous silicon) followed by a metal electrodeless etching method (to form the nanowires), particularly of the type used for low resistivity silicon wafers.

An up-conversion layer 14 is sandwiched between the first electrode 12 and the n-type silicon layer 22. The up-conversion layer 14 converts low-energy photons, which are reflected from the first electrode 12, into higher-energy photons, which can then be absorbed by the photoactive region, contributing to the overall photocurrent. Any suitable type of up-conversion material may be used for the up-conversion layer 14, such as $NaYF_4$:Er—Yb or the like. Typically, $NaYF_4$:Er—Yb is particular to improving performance in the infrared region of solar radiation, thus it should be understood that the material used to form up-conversion layer 14 may be varied dependent upon the particular frequency band(s) of interest. Examples of other materials which may be used as the up-conversion material include $NaYF_4$:Yb—Tm, $NaYF_4$:Yb—HO, $NaYF_4$:Yb—Er—Nd, $NaYF_4$:Er, $YF_3$:Er, $CaF_2$:$E_4$, $Y_2O_3$:Er, $BaC_{12}$:Er, as well as $NaYF_4$-based core-shell nanoparticles and $NaGdF_4$-based core-shell nanoparticles as host materials doped or co-doped with $NaYF_4$:Er—Yb or core-shell-shell nanocrystals.

Figure 2:
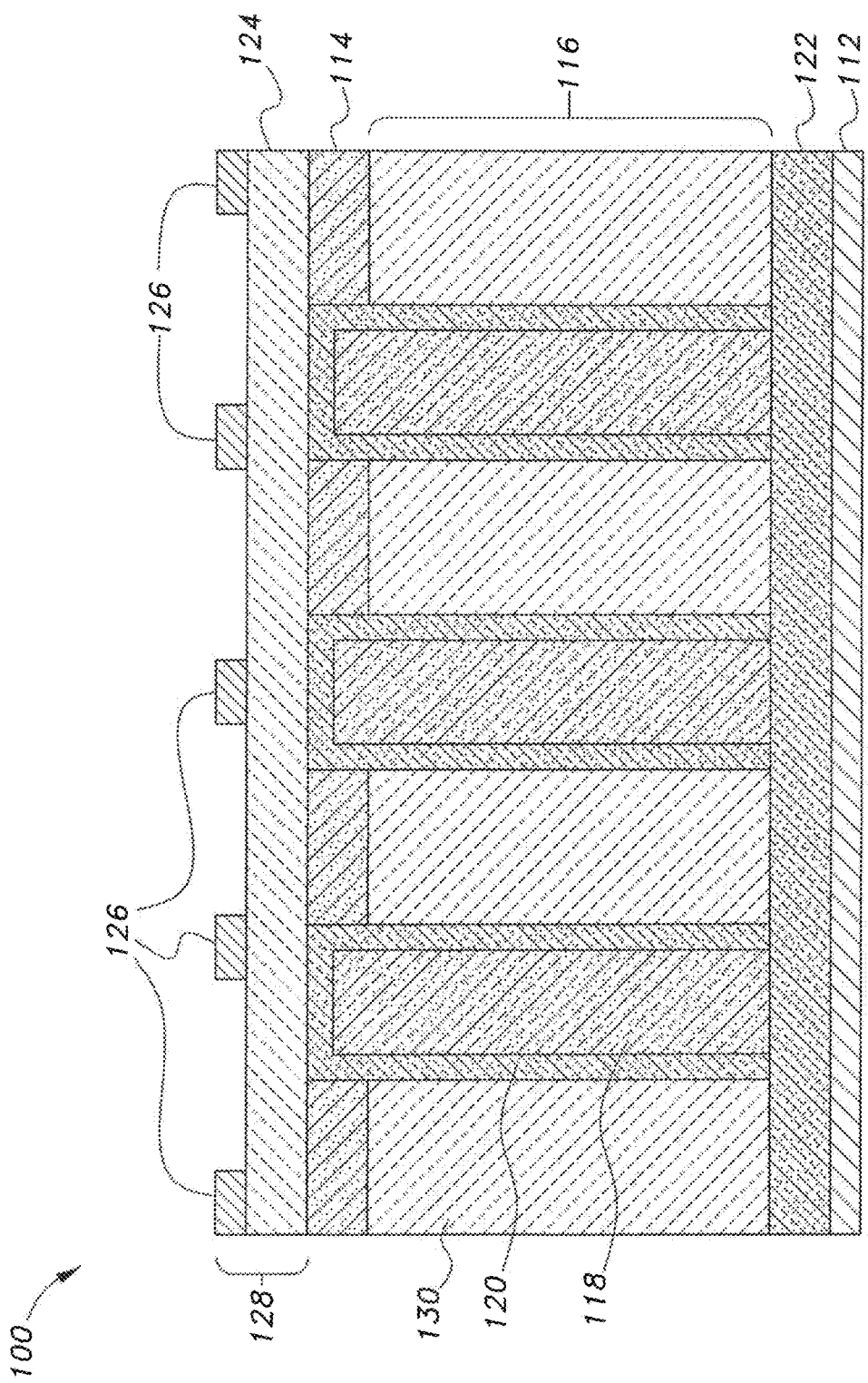
FIG. 2 is a side view in section of an alternative embodiment of the porous silicon nanowire photovoltaic cell.

In the alternative embodiment of FIG. 2, the up-conversion layer 14 of porous silicon nanowire photovoltaic cell 10 is replaced by a down-conversion layer 114 in the alternative porous silicon nanowire photovoltaic cell 100. In this embodiment, porous silicon nanowire photovoltaic cell 100 includes a first electrode 112, which may be formed from any suitable type of metal or the like, a p-type silicon layer 122, and a second electrode 128 formed from a transparent electrode 124 and at least one metal contact 126, as in the previous embodiment. Further, a photoactive layer is formed from a vertical array of porous silicon nanowires 116 partially embedded in indium tin oxide 130. Each porous silicon nanowire 116 is formed from a porous p-type silicon core 118 coated with a layer of n-type silicon 120. The down-conversion layer 114 fills the space between the second electrode 128 and the indium tin oxide filler 130 thus, the vertical array of porous silicon nanowires 116 is partially embedded in the ITO filler 130, and partially embedded in the down-conversion layer 114, with the ITO filler 130 and the portion of the vertical array of porous silicon nanowires 116 embedded therein forming the photoactive layer. The photoactive layer is positioned between the p-type silicon layer 122 and the down-conversion layer 114. Any suitable type of down-conversion material may be used for the down-conversion layer 114, such as $LiGdF_4$:$Eu^{3+}$ or the like. As in the previous embodiment, the photoactive region may alternatively be formed from luminescent quantum dots or metal nanoparticles, either alone or embedded in the ITO 130.

It is to be understood that the porous silicon nanowire photovoltaic cell is not limited to the specific embodiments described above, but encompasses any and all embodiments within the scope of the generic language of the following claims enabled by the embodiments described herein, or otherwise shown in the drawings or described above in terms sufficient to enable one of ordinary skill in the art to make and use the claimed subject matter.

I claim:

1. A porous silicon nanowire photovoltaic cell, comprising:
    a first electrode;
    an p-type silicon layer;
    a second electrode comprising a transparent electrode and at least one metal contact;
    a photoactive layer comprising a vertical array of porous silicon nanowires partially embedded in an indium tin oxide filler, wherein each said porous silicon nanowires comprises a porous p-type silicon core coated with a layer of n-type silicon, the photoactive layer being positioned between the p-type silicon layer and the second electrode, the second electrode making direct contact with the layer of n-type silicon; and
    a down-conversion layer completely filling a space between the second electrode and the indium tin oxide filler of the photoactive layer.

2. The porous silicon nanowire photovoltaic cell as recited in claim 1, wherein the down-conversion layer comprises $LiGdF_4$:$Eu^{3+}$.

3. The porous silicon nanowire photovoltaic cell as recited in claim 1, wherein the transparent electrode is formed from a material selected from the group consisting of indium tin oxide, luminescent quantum dots, metal nanoparticles and combinations thereof.

* * * * *